(12) United States Patent
Kloster et al.

(10) Patent No.: US 6,946,384 B2
(45) Date of Patent: Sep. 20, 2005

(54) STACKED DEVICE UNDERFILL AND A METHOD OF FABRICATION

(75) Inventors: Grant M. Kloster, Lake Oswego, OR (US); Michael D. Goodner, Hillsboro, OR (US); Shriram Ramanathan, Hillsboro, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/455,934

(22) Filed: Jun. 6, 2003

(65) Prior Publication Data

US 2004/0245634 A1 Dec. 9, 2004

(51) Int. Cl.[7] .................. H01L 21/4763; H01L 21/302
(52) U.S. Cl. ...................... 438/622; 438/626; 438/633; 438/691
(58) Field of Search .................. 438/622, 626, 438/633, 691, 692; 257/758

(56) References Cited

U.S. PATENT DOCUMENTS 5,846,853 A * 12/1998 Otsuki et al. ............... 438/119
6,319,837 B1 * 11/2001 Chittipeddi et al. ........ 438/692
6,555,477 B1 * 4/2003 Lu et al. ..................... 438/692

OTHER PUBLICATIONS

Stanley Wolf Ph.D. and Richard N. Tauber Ph.D. in Silicon Processing for the VLSI Era, vol. 1: Process Technology, Lattice Press, 1986, pp. 539–542.*

Stanley Wolf Ph.D. and Richard N. Tauber Ph.D. in Silicon Processing for the VLSI Era, vol. 1: Process Technology, Lattice Press, 1986, pp. 430–441, 518–9.*

* cited by examiner

Primary Examiner—William M. Brewster
(74) Attorney, Agent, or Firm—Blakely, Sokoloff, Taylor & Zafman LLP

(57) ABSTRACT

Numerous embodiments of a stacked device underfill and a method of formation are disclosed. In one embodiment, a method of forming stacked semiconductor device with an underfill comprises forming one or more layers of compliant material on at least a portion of the top surface of a substrate, said substrate, curing at least a portion of the semiconductor device, selectively removing a portion of the one or more layer of complaint material, and assembling the substrate into a stacked semiconductor device.

23 Claims, 5 Drawing Sheets

STACKED DEVICE UNDERFILL AND A METHOD OF FABRICATION

BACKGROUND

In the manufacture of microelectronic devices, packaging density is becoming increasingly important. Stacking of the dice of a multi-processor microelectronic device is one way to improve the packaging density of a microelectronic device. Stacked microelectronic devices are typically formed by stacking two or more wafers with integrated circuitry formed thereon, and then dicing the stacked wafers into individual stacked devices. FIG. 5 illustrates a stacked microelectronic device 236, which may result from the fabrication technique briefly described above. Device 236 comprises a first microelectronic die 216 having an active surface 218, and an integrated circuitry layer 222, which contains integrated circuitry not shown in detail. Typically, the integrated circuitry layer is formed to a depth of approximately 10 microns. An interconnect layer 224 is formed on the die 216, and is illustrated as a plurality of interconnect structures, but may additionally comprise multiple layers of conductive traces separated by dielectric material (not shown). The interconnect layer 224 provides routes for electrical communication between integrated circuits, integrated circuit components, and external devices, for example.

Device 236 comprises a second microelectronic die 202, which additionally contains an integrated circuitry layer 208 and an interconnect layer 212. The physical attachment of interconnect layer 224 to interconnect layer 212 may electrically interconnect integrated circuitry layer 222 with integrated circuitry layer 208. Die 202 may be thinned, prior to dicing, and a plurality of conductive vias 228 may be formed on the back surface 226 to be in electrical contact with the integrated circuitry layer 208. A plurality of solder balls 232 may be formed such that one or more solder balls are in electrical contact with one or more vias. Formation of the plurality of vias 228 and plurality of solder balls 232 may make it possible to route input/output signals, power, and ground to and from the integrated circuitry layers, for example.

Typically, thinning of one of the stacked wafers is performed by use of one or more mechanical and/or chemical processes, such as a polishing process, for example. These processes may cause mechanical stresses in the unsupported portions of the wafer being thinned. Unsupported portions of the wafer may include, for example, the areas of the wafer not supported by interconnect structures, for example. These mechanical stresses may result in undesirable effects such as chipping, cracking, or other mechanical damage, which may result in the wafer and/or individual stacked devices being unusable. A need, therefore, exists for a method of forming stacked devices that reduces or eliminates these undesirable effects.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Embodiments of the claimed subject matter may comprise an underfill for stacked devices and a method of fabrication. In one embodiment, a method of forming an underfill for a stacked device comprises depositing a material layer on at least a portion of the active surface of a substrate, wherein the active surface has a plurality of interconnects formed thereon, curing at least a portion of the substrate, selectively removing a portion of the material layer, and assembling the wafer into a stacked wafer structure, wherein the material layer may be one or a combination of materials, such as nonconductive polymer materials, for example.

Figure 5:
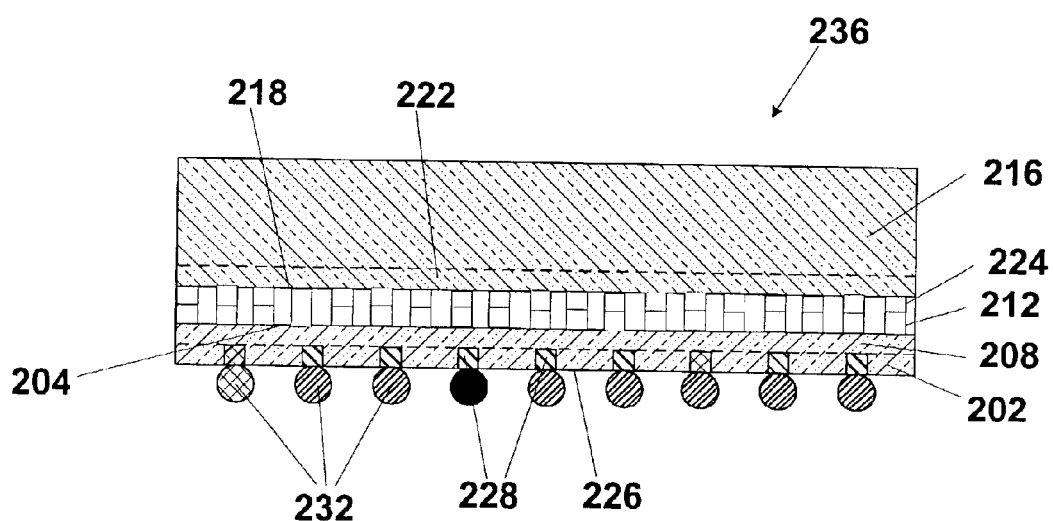
FIG. 5 is an illustration of stacked microelectronic device, as known in the art.

As mentioned previously, during fabrication of a device such as a stacked microelectronic device, one or more fabrication processes may cause stresses in one or more of the stacked wafers, which may result in physical damage. One such fabrication process is a thinning process, typically performed on one of the stacked wafers prior to dicing of the wafers into individual stacked devices. As illustrated in FIG. 5, die 202 is substantially thinner than die 216, but die 202 may initially be the same thickness as die 216 when initially assembled into stacked wafers. For example, both die 202 and die 216 may be 700 to 800 microns thick prior to dicing and thinning, and die 202 may subsequently be thinned to a thickness of 10 to 100 microns, in order to allow for the formation of conductive vias and provide communications routes for the stacked device, as explained previously. During the thinning process, which may comprise chemical mechanical polishing (CMP), grinding, or a silicon wet etch, for example, unsupported regions between interconnect structures may flex, which may cause portions of the die 202 to crack or chip. This physical damage to die 202 may reduce or destroy the functionality of the die, and may additionally cause contaminant incursion, resulting in damage to other dies on the wafer, for example.

As will be understood by those of skill in the art, microelectronic wafers used in one or more of the following embodiments may include any substrate capable of having integrated circuitry formed thereon, including silicon, germanium, indium telluride, or gallium antimonide, to cite just a few examples. Additionally, it will be understood that circuitry formed on substrates such as those described may be any circuitry, including circuitry used in central processing units (CPUs), chipsets, memory or application specific integrated circuits (ASICs). For example, when assembled into a stacked device, one embodiment may comprise an Intel® Corporation Stacked Chip Scale (Stacked-CSP) product such as Intel StrataFlash® memory. Finally, it will be understood that the individual dies of devices formed in accordance with one or more of the foregoing embodiments may comprise identical or differing integrated circuits, for example.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures and components have not been described in detail so as not to obscure the embodiments of the claimed subject matter. It can be appreciated that the specific structural and functional details disclosed herein may be representative and do not necessarily limit the scope of the claimed subject matter.

Figure 1:
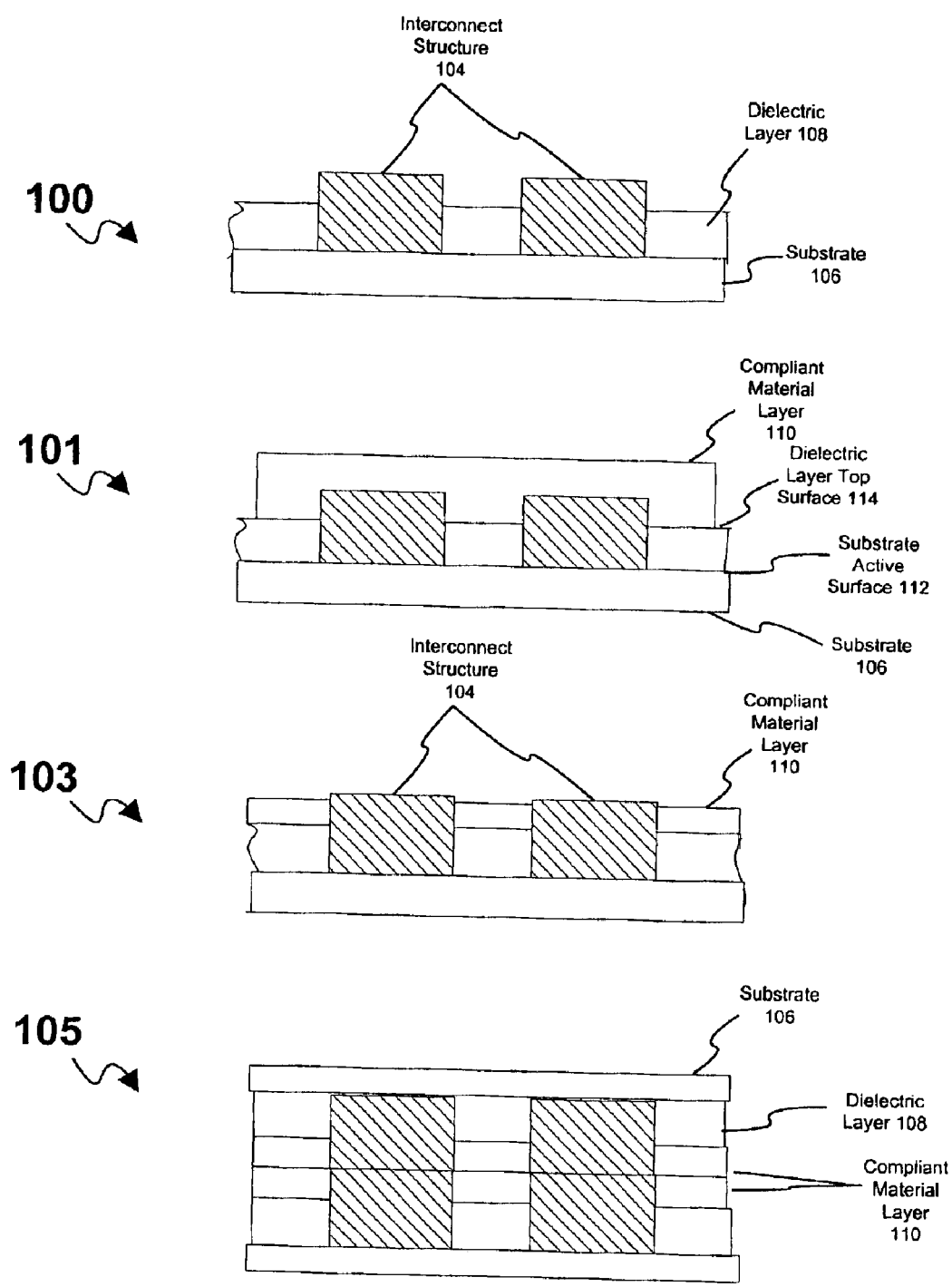
FIG. 1 illustrates several phases of formation of a stacked microelectronic device in accordance with at least one embodiment.

Referring now in detail to the drawings wherein like parts are designated by like reference numerals throughout, there is illustrated in FIG. 1 four phases of formation of a stacked device with an underfill, in accordance with at least one embodiment of the claimed subject matter. Phase 100 illustrates a substrate 106, with a dielectric layer 108 and interconnect structures 104 formed thereon. Substrate 106 may comprise a semiconductor substrate such as a silicon substrate, for example, and may represent a portion of a silicon wafer after patterning of interconnects and formation of a dielectric layer, for example. Substrate 106 may comprise a microelectronic die having an active surface 112, and one or more integrated circuitry layers, which may contain integrated circuitry not shown in detail. Typically, the integrated circuitry layer is formed to a depth of approximately 10 microns. Formed on the active surface 112 of substrate 106 are interconnect structures 104, which may comprise a plurality of copper structures, for example, and although illustrated as a plurality of interconnect structures, they may additionally comprise multiple layers of conductive traces. Interconnect structures 104, which may alternatively be referred to as copper lines, may be raised with respect to the top surface 114 of the dielectric layer 108, in at least one embodiment. The device shown in phase 100 may be formed by any number of well-known fabrication techniques, but it is important to note that the claimed subject matter is not limited in this respect.

Phase 101 illustrates the formation of an underfill, which may comprise a material layer 110, on at least a portion of the active surface 112 of substrate 106, which may include the top surface 114 of dielectric layer 108. The material layer may be described as a compliant material, and, in this particular context, compliant refers to the ability of the material to provide some degree of structural support for the stacked device when used as an underfill material, and use of this term does not necessarily infer any material property limitations. Formation of the compliant material layer may be performed by any number of methods, but one such method comprises a deposition process, which may deposit one or more materials, such as a polymer material, on a substantial portion of the top surface of the dielectric layer 108, for example. Numerous materials or combinations of materials may be utilized to form the compliant material layer 110. Examples of suitable materials may include, for example, soft polymers such as the Unity 400® product available from Promarus, Inc., but it is important to note that the claimed subject matter is not limited in this respect, but any material providing desirable material properties for the purposes described herein may be used in at least one embodiment. As stated previously, formation of the layer of compliant material may be performed by use of one or more well-known processes. Two suitable formation processes include spin coating and dip coating. Additionally, it is important to note that the claimed subject matter is not limited to the formation of a single layer of compliant material, but numerous layers of materials, which may be varying materials, may be formed on a substrate in alternative embodiments, and these multiple layers may be formed by use of differing formation processes, for example.

Phase 103 illustrates an additional phase of formation of a stacked device with an underfill layer in accordance with one embodiment of the claimed subject matter. Illustrated in phase 103 is substrate 106 with interconnect structures 104 and a dielectric layer 108 formed thereon, and a layer of compliant material 110 additionally formed thereon. As shown in phase 103, a portion of the compliant material has been removed, in order to expose at least a portion of the interconnect structures 104. Depending at least in part on the material(s) used as a compliant material, one or more curing processes may be performed prior to the removal of a portion of the compliant material. For example, if a polymer material such as the Unity 400 product is used to form the compliant material, the material may be cured by heating the device shown in phase 101, by heating to an elevated temperature such as 300 degrees Celsius, for example, but of course the claimed subject matter is not so limited.

Selective removal of a portion of the compliant material layer 110 may be accomplished by use of a variety of methods, and may depend at least in part on the type of material or combination of materials used to form the compliant material layer 110. Examples of such methods of removal may comprise a chemical mechanical polishing process (CMP), which comprises the use of one or more chemicals and one or more mechanical processes in order to remove particular portions of a layer of material, for example, or a dry etching process, such as reactive ion etching (RIE), although numerous other methods of removal exist, including grinding or spin etching. The compliant material layer 110 may be selectively removed, or polished back, such that at substantial portion one or more of the interconnect structures 104 are exposed, and in one exemplary embodiment, the compliant material layer may be polished back such that the top surface of the compliant material is slightly lower than the top surface of one or more interconnect structures, for example.

Illustrated in phase 105 is an additional phase of formation of a stacked device with an underfill in accordance with one embodiment. Illustrated in phase 105 are two substrates each with a dielectric layer, a plurality of interconnect structures and a plurality of compliant material layers formed therebetween. In this embodiment, both of these substrates with devices formed thereon may be formed by use of at least one of the above-described formation processes, and in one particular embodiment, both substrates with devices formed thereon are formed by use of substantially identical processes, or as part of the same formation process. As shown in phase 105, the two substrates, which may comprise individual semiconductive wafers, may be aligned such that the interconnect structures are substantially opposing. In one embodiment, the interconnect structures may be placed in physical contact, and may subsequently be bonded, and this may be a result of material creep, for example. In one embodiment, the interconnect structures may be bonded by elevating the temperature of the structures, and depending in part on the material or combination of materials used for the compliant material layer, a temperature not exceeding the curing temperature of the compliant material(s) may be used for the bonding process, although, of course, the claimed subject matter is not so limited. Although in phase 105, the two compliant material layers are shown in contact, after bonding of the interconnect structures of the two substrates, the compliant layers may not initially be in physical contact, Depending on the materials used to form the interconnect structures, as well as the method or combination of methods used to form the structures, the interconnect structures may deform or creep after bonding, which may cause the compliant material layers to deform, and come in contact with one another.

Figure 2:
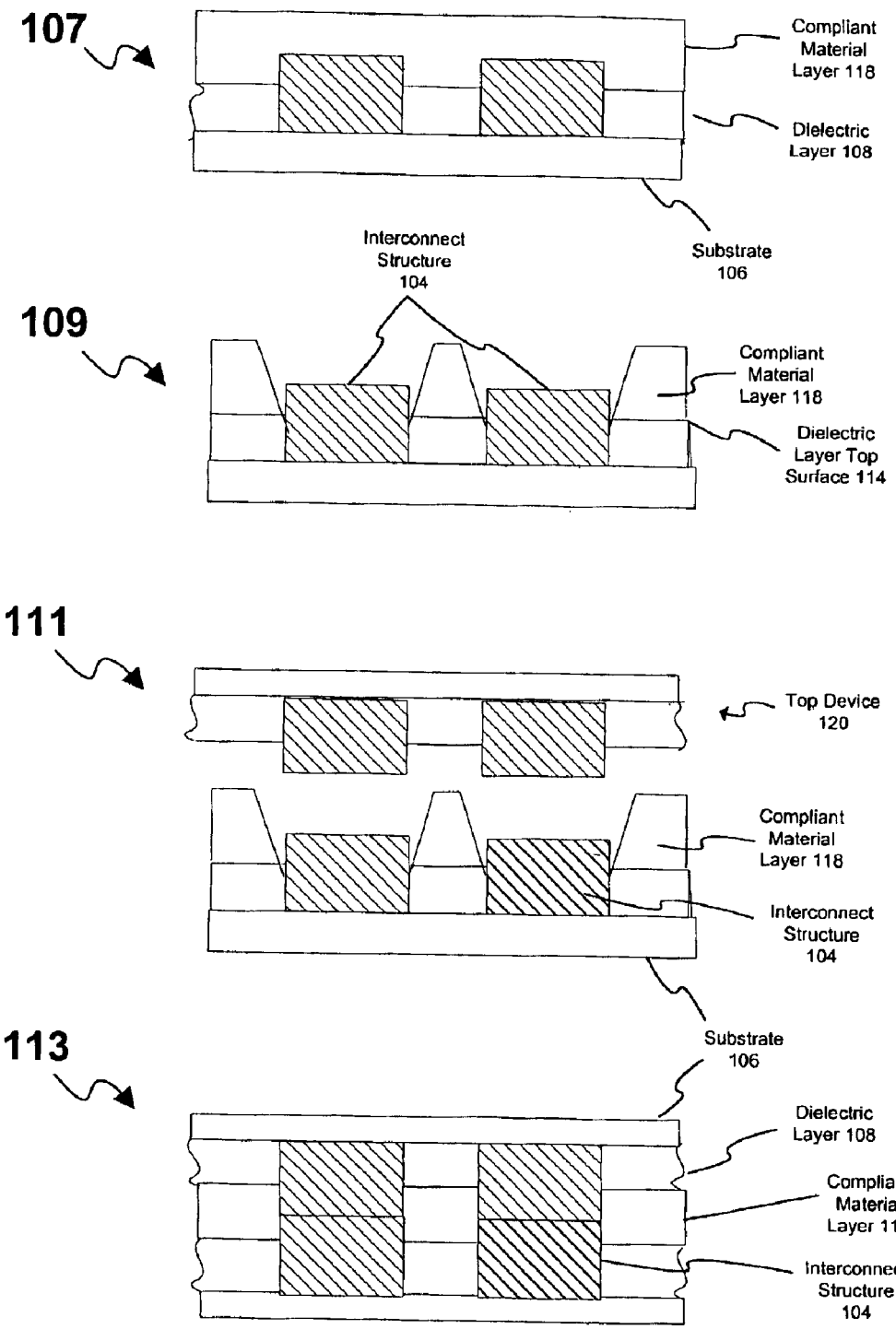
FIG. 2 illustrates several phases of formation of a stacked microelectronic device in accordance with at least one embodiment.

Illustrated in FIG. 2 are several phases of formation of a stacked device with an underfill, in accordance with another embodiment of the claimed subject matter. Illustrated in FIG. 2 are four phases of formation, which may be used to at least partially illustrate an additional method of formation of a device with a material layer in accordance with the claimed subject matter. Phase 107 illustrates a substrate 106 with interconnect structures 104 formed thereon, as well as a dielectric layer formed thereon. The substrate may comprise a semiconductive wafer, for example, and may be formed as described in reference to phase 100 of FIG. 1, for example. Shown formed on a substantial portion of the top surface 114 of dielectric layer 108 is a compliant material layer 118. The compliant material layer may comprise a single material or a combination of materials, as well as one or more layers of materials. In one embodiment, compliant material layer 18 comprises a photodefineable polymer material such as polyimide, polybenzoxazole, a photodefinable siloxane, Novolak® (also known as novolac or novolak), or a polynorborene buffer, for example, but it is important to note that any material exhibiting desirable properties including compliance and photodefinability, for example.

Formation of the compliant material layer 118 may be accomplished by a number of methods, and may depend at least in part on the type of material or combination of material used to form the layer 118. One such method, which may be used to form a compliant material layer substantially comprising polyimide may comprise spin coating. However, additional methods including dip coating, spraying and screen-printing may be used in alternative embodiments. In this embodiment, the polyimide may be spin coated on the top surface 114 of dielectric layer 108 to a particular thickness, which may comprise a thickness slightly greater than the gap between substrates when the substrate is assembled into a stacked device, for example. Forming the material layer to this particular thickness may provide desirable properties such as a slight compression of the material layer when is assembled into a stacked device.

Phase 109 illustrates a partially formed stacked device wherein the compliant material layer 108 has been partially removed, in order to expose a portion of one or more interconnect structures. Methods for removing a portion of the compliant material layer may vary, but, again, this may depend at least in part on the material or combination of materials used to form layer 118. In one embodiment, a photodefineable material may be used to form layer 118, and a photolithography process may be used to expose the material in selected regions to light, and then removed the exposed regions of layer 118. In one embodiment of a photolithography process, a photodefineable material is exposed to light a particular wavelength, by use of a stepper or mask aligner, for example, and is then developed, making the exposed material more easily removed (i.e. a positive tone material). In other embodiments, the photodefinable material may be exposed to light, making the unexposed material more easily removed (i.e. a negative tone material). Depending at least in part on the material used to form the layer 118, the amount of material removed may vary. For example, if the material used exhibits a positive print bias, more space may be left around the interconnects after the material is removed. In one embodiment, the top surface of one or more interconnects may be exposed by removing a portion of layer 118, and, additionally, some material may be removed proximate to one or more interconnects, such as the sides of the interconnects, and this may be performed in order to allow for deformation of the material layer 118 after final assembly, for example. Additionally, a curing process may be incorporated into the formation of a stacked device, and the curing may be performed on the material layer 118 after removal of a portion of the layer 118, for example, and this may cause the material(s) used to form layer 118 to shrink, for example. In addition to the above described processes, a portion of the compliant material shown in phase 109 may be subjected to one or more surface treatments, such as application of an adhesion promoter or a chemical etch, and this may be performed in order to improve the adhesion properties of the layer 118, for example.

Phase 111 illustrates two partially formed devices, which may be semiconductive wafers, for example. Top device 120 may comprise a substrate with interconnect structures and a dielectric layer, for example, and may have been formed by one or more well known fabrication processes, as described in more detail in reference to FIG. 1 phase 100. Formation of a stacked device may comprise alignment of the top device over the substrate with material layer 118, and in one embodiment the interconnects of one substrate may be aligned to opposing interconnects on the other substrate, and the interconnects may then be placed into physical contact, which may cause electrical connectivity between the interconnects. Phase 113 illustrates a stacked device formed after the two substrates are substantially bonded. As shown in phase 113, the interconnects are in physical contact, and the material layer 118 has deformed to comply with the void formed between substrates where no interconnects are formed. Although phase 113 illustrates a stacked device where layer 118 has completely tilled the voids between interconnects, this is for illustrative purposes only, and the claimed subject matter is not so limited. For example, after layer 118 has deformed, voids between interconnects may not be completely filled, but may only be partially filled, depending on the material(s) used to form layer 118, as well as the process or processes used for selectively remove portions of layer 118, for example. Any method of formation of an underfill material wherein voids in a stacked device are reduced may be used in accordance with at least one embodiment.

Figure 3:
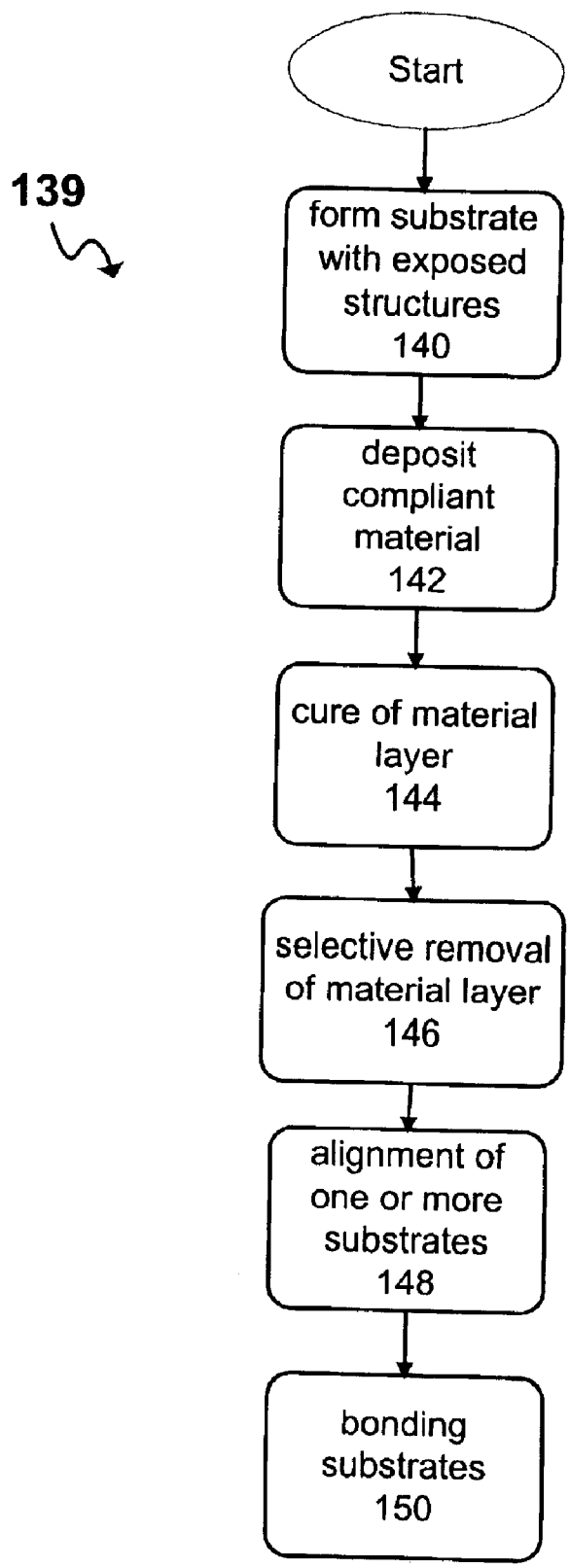
FIG. 3 is a process flow diagram illustrating one method of formation of a stacked microelectronic device in accordance with at least one embodiment.

FIG. 3 illustrates a process flow diagram illustrating the processes used to form a stacked device with an underfill in accordance with at least one embodiment. The flowchart 139 illustrated in FIG. 3 may be used to substantially perform the phases of formation illustrated in FIG. 1, for example, although the process flow is not limited in this respect, and the order in which the functional blocks are presented do not necessarily limit the claimed subject matter to any particular order, and several intervening functional blocks may be used within the scope of the claimed subject matter. In this embodiment, one or more substrates with exposed structures are formed at functional block 140, one or more materials, such as compliant materials including polymers, are deposited on a substantial portion of the substrate at functional block 142, forming a layer of material; the material layer is substantially cured at functional block 144; a portion of the material layer is selectively removed at functional block 146; the one or more substrates are aligned with one or more other substrates at functional block 148; and at functional block 150 the one or more substrates are bonded to the substrates to which they are aligned.

In one embodiment, at functional block 140, formation of one or more substrates with exposed structures may comprise forming a substrate with a plurality of interconnects, which may comprise a silicon wafer, for example, wherein the silicon wafer may have an active surface with one or more layers of circuitry bonded to the interconnects, for example, and the circuitry may comprise a CPU, ASIC, or an Intel StrataFlash® memory device, for example. Many methods of formation of a substrate such as described exist, and the claimed subject matter is not limited in this respect. A substrate such as illustrated as phase 100 of FIG. 1 may be formed by use of one or more of these well-known methods, for example.

In one embodiment, at functional block 142, depositing a material layer may comprise one or more deposition processes that result in the depositing of one or more layers of a material or combination of materials on a substantial portion of a substrate. Such materials may include compliant materials including polymers, such as the Unity 400 product, for example. Methods of depositing the material layer may include, for example, dip coating, spray coating or screen-printing, for example, and may depend at least in part on the material or combination of materials used to form the material layer.

In one embodiment, at functional block 144, curing of the material layer may comprise subjecting the material layer to one or more curing processes, which may entail introducing the substrate with the material layer formed thereon to an elevated temperature for a particular period of time. Methods used for curing may vary, and depending on the material(s) used to form the material layer, no curing process may be performed, for example. In one particular embodiment, a polymer material comprising the previously mentioned Unity 400 may be cured by heating the polymer material to a temperature of approximately 300 C for approximately 20 minutes, as just an example.

In one embodiment, at functional block 146, selective removal of the material layer may comprise removing a portion of the material from the material layer by use of one or more mechanical and/or chemical processes, such as dry etching or a chemical mechanical polishing process, for example. Methods used for selective removal may depend at least in part on the composition of the material layer, and may comprise multiple processes, for example. The material layer, in one embodiment, may be selectively removed such that the top surface of one or more interconnect structures are exposed, for example, in order to allow for bonding of the interconnects to other substrate interconnects. In one embodiment, a portion of a layer of polymer may be selectively removed by using a chemical mechanical polish, which removes a portion of the polymer layer until the polymer layer is slightly recessed in reference to one or more interconnect structures formed on the substrate, for example.

In one embodiment, at functional block 148, alignment of one or more substrates may comprise aligning a substrate formed by the above process to an opposing substrate, which may have additionally been formed by use of the above-described process, although the claimed subject matter is not so limited. In this embodiment, the interconnect structures formed on one substrate may have similar interconnect structures formed on the opposing substrate, and these structures may be placed in opposition to each other such that the top surfaces of the interconnect structures of opposing substrates are capable of being placed in physical contact. At functional block 150, bonding the substrates, in one embodiment, may comprise placing these interconnect structures into physical and/or electrical contact, and may comprise application of pressure, and or an elevation of temperature to complete the bonding process. The stacked device formed by use of the process as described above may be used as a stacked device with an underfill, for example.

Figure 4:
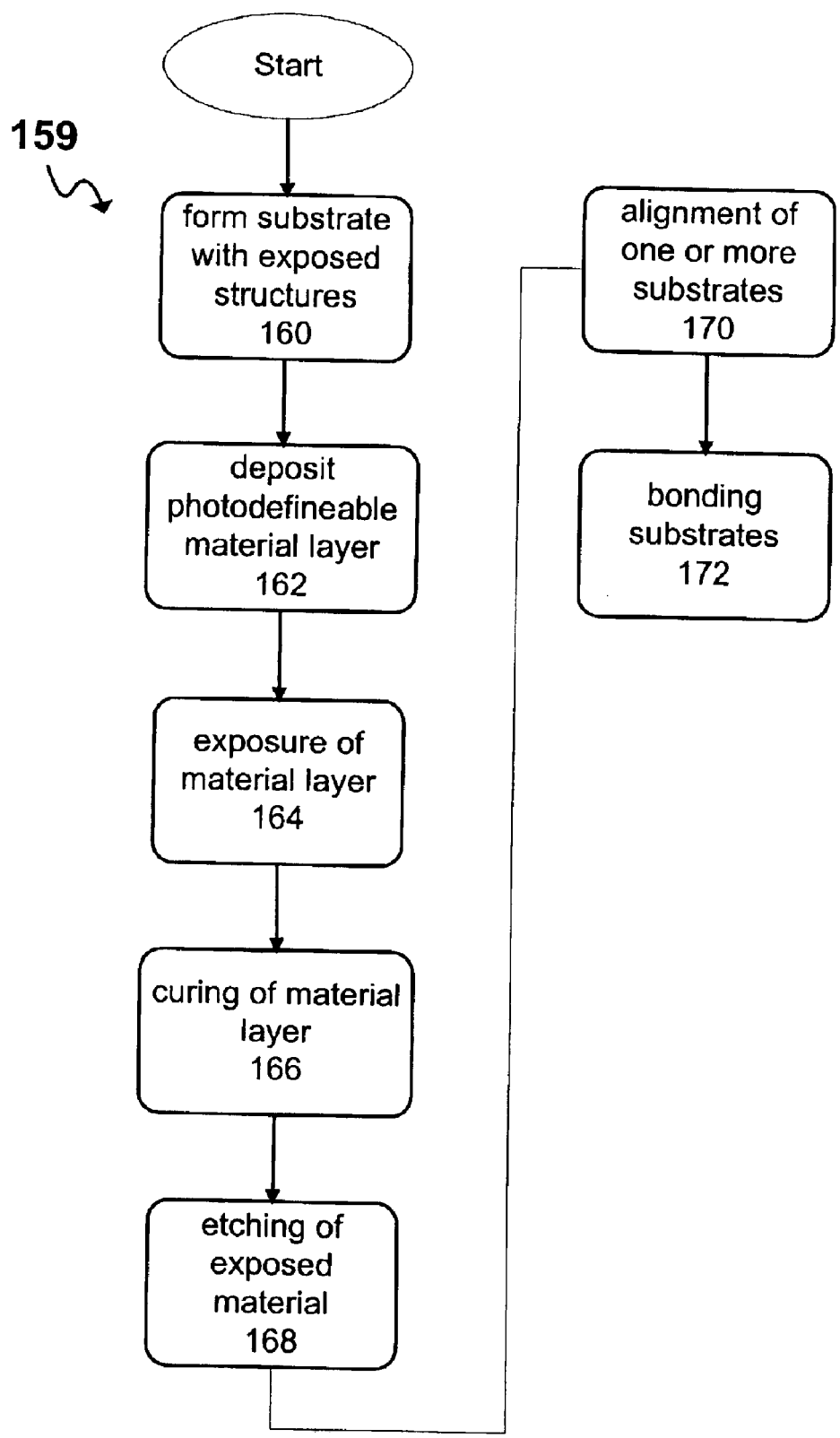
FIG. 4 is a process flow diagram illustrating another method of formation of a stacked microelectronic device in accordance with at least one embodiment.

FIG. 4 illustrates a process flow diagram 159, illustrating the processes used to form a stacked device with an underfill in accordance with at least one embodiment. The flowchart 159 illustrated in FIG. 4 may be used to substantially perform the phases of formation of a stacked device as illustrated in FIG. 1, for example, although the order presented does not infer a particular order nor limit the process flow to just these discrete functions. In this embodiment, one or more substrates with exposed structures are formed at functional block 160; a photodefineable material or combination of photodefineable and/or non-photodefineable materials are deposited at functional block 162 to form a material layer; the material layer is exposed at functional block 164; the material layer may be cured at functional block 166; the exposed photodefineable material of the material layer may be etched at functional block 168; the substrate may be aligned with one or more other substrates at functional block 170; and at functional block 172, the one or more substrates are bonded to the substrates to which they are aligned.

In one embodiment, at functional block 160, formation of one or more substrates with exposed structures may comprise forming a substrate with a plurality of interconnects, which may comprise a semiconductive wafer with a plurality of interconnects, wherein the semiconductive wafer may have an active surface with one or more layers of circuitry bonded to the interconnects, for example, and may comprise a silicon wafer with circuitry formed thereon, which itself forms devices such as CPUs, ASICs or memory devices, for example. Many methods of formation of a substrate such as described exist, and the claimed subject matter is not limited in this respect. A substrate such as illustrated as phase 100 of FIG. 1 may be formed by use of one or more of these well-known methods, for example.

In one embodiment, at functional block 162, depositing a material layer may comprise one or more deposition processes that result in the depositing of one or more layers of one or a combination of materials, such as one or more polymer materials, on a substantial portion of a substrate, wherein at least one of the layers comprises a photodefinable polymer material. Such methods may include, for example, dip coating, spray coating or screen-printing, for example. As described previously, many materials may be used to form the polymer layer on a substrate, for example, polyimide, polybenzoxazole, Novolak® (also known as novolac or novolak), or a polynorborene buffer, as explained previously.

In one embodiment, at functional block 164, exposure of the material layer may comprise exposing a portion of the photodefinable material to light a particular wavelength, by use of a stepper or mask aligner, for example. The exposed material is then developed, making either the exposed material or the unexposed material more easily removed, depending on the tone of the material. Depending at least in part on the material used to form the layer of photodefinable material, the amount of material removed may vary. As explained previously, if the material used exhibits a positive print bias, more space may be left around the interconnects after the material is removed.

In one embodiment, at functional block 166, curing of the material layer may comprise subjecting the material layer to one or more curing processes, which may be introducing substrate with the material layer formed thereon to an elevated temperature for a particular period of time. Methods used for curing may vary, and depending on the material (s) used to form the material layer, curing may cause the material to deform, and in some embodiments no curing process may be performed. In one particular embodiment, a material layer comprising polyimide may be deposited on a substrate, and may be cured by heating the polyimide material to a temperature of approximately 300 C for 90 minutes, as just an example.

In one embodiment, at functional block 168, selective removal of the material layer may comprise removing material from the material layer by use of one or more etching processes, such as a chemical etch. Methods used for selective removal may depend at least in part on the composition of the material layer, and may comprise multiple processes, for example. The material layer may be selectively removed such that the top surface of one or more interconnect structures are exposed, for example, in order to allow for bonding to other substrates. Additionally, as described previously in reference to FIG. 2, more or less material may be removed from the top or the sides of the interconnect structures, if, for example, the material used to form the material layer exhibits a positive print bias. Additionally, the material layer may be selectively removed such that the top surface of the material layer is higher with respect to the top surface of one or more interconnects, in order to provide a slight compression in the material layer after final assembly.

In one embodiment, a portion of a layer of photodefinable polymer may be selectively removed after exposure by using a chemical etch, resulting in the removal of a portion of the polymer layer until one or more interconnect structures top surface is exposed, for example. In alternative embodiments, where photodefinable and non-photodefinable materials are used to form the material layer, only the portion of the material layer comprising photodefinable material that has been exposed may be removed, for example. In addition to the above described processes, a portion of the material layer may be subjected to one or more surface treatments, such as application of an adhesion promoter or a chemical etch, and this may be performed in order to improve the adhesion properties of the layer, for example.

In one embodiment, at functional block 170, alignment of one or more substrates may comprise aligning a substrate formed by the above process to an opposing substrate, which may have additionally been formed by use of the above-described process, although the claimed subject matter is not so limited. In this embodiment, the interconnect structures formed on one substrate may have similar interconnect structures formed on the opposing substrate, and these structures may be placed in opposition to each other such that the top surfaces of the interconnect structures of opposing substrates are capable of being placed in physical contact. At functional block 172, bonding the substrates, in one embodiment, may comprise placing these interconnect structures into physical and/or electrical contact, and may comprise application of pressure, and or an elevation of temperature to complete the bonding process, which may be a result of material creep in the interconnect structures. The stacked device formed by use of the process as described above may be used as a stacked device with an underfill, for example.

It can be appreciated that the embodiments may be applied to the formation of any stacked microelectronic device. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still remain in accordance with the claimed subject matter. It is, therefore, to be understood that the appended claims are intended to cover all such modifications and changes as fall within the true spirit of the embodiments of the claimed subject matter.

What is claimed is:

1. A method of forming a stacked semiconductor device, comprising:

forming one or more layers of compliant material on at least a portion of a substrate, said substrate having one or more interconnect structures formed thereon;

curing at least a portion of the one or more layers of compliant material;

selectively removing a portion of the one or more layers of compliant material such that a first top surface of the one or more layers of compliant material is lower than a second top surface of the one or more interconnect structures; and assembling the substrate into a stacked semiconductor device that is supported structurally by said compliant material, and wherein said complaint material is located between at least two substrates within said stacked semiconductor device.

2. The method of claim 1, wherein one or more layers of compliant material comprise non-conductive compliant material, and wherein the one or more layers of compliant material is subjected to one or more surface treatments to improve an adhesion property of the one or more layers of compliant material.

3. The method of claim 2, wherein one or more layers of compliant material comprise a polymer based layer, and wherein a gap is maintained around the one or more interconnect structures and the one or more layers of compliant material when the one or more layers of compliant material exhibit a positive print bias.

4. The method of claim 3, wherein one or more layers of compliant material comprise a photodefinable polymer layer.

5. The method of claim 1, wherein one or more layers of compliant material are formed by a deposition process.

6. The method of claim 1, wherein one or more layers of compliant material are formed by one or more of: spin coating, dip coating and spraying.

7. The method of claim 1, wherein one or more layers of compliant material is formed to a height above the second top surface of each one of the interconnect structures to provide a compression in the one or more layers of compliant material after a final assembly.

8. The method of claim 1, wherein said curing process comprises an oven curing process.

9. The method of claim 1, wherein the selective removing comprises one or more of: chemical mechanical polishing (CMP), reactive ion etching (REI), and grinding.

10. The method of claim 1, wherein the selective removing comprises one or more chemical etching processes.

11. The method of claim 1, wherein one or more layers of compliant material is selectively removed such that the compliant material is removed from the top surface of one or more interconnect structures.

12. A method of forming a stacked semiconductor device, comprising:

forming one or more layers of photodefinable material on at least a portion of a substrate, said substrate having one or more interconnect structures formed thereon;

exposing at least a portion of the one or more layers to radiation;

curing at least a portion of the one or more layers;

selectively etching a portion of the one or more layers of photodefinable material such that a first top surface of the one or more layers of photodefinable material is lower than a second top surface of the one or more interconnect structures; and assembling the substrate into a stacked semiconductor device that is supported structurally by said photodefinable material, and wherein said photodefinable material is located between at least two substrates within said stacked semiconductor device.

13. The method of claim 12, wherein the one or more layers of photodefinable material is subjected to one or more surface treatments to improve an adhesion property of the one or more layers of photodefinable material.

14. The method of claim 12, wherein said one or more layers of photodefinable material is formed to a height above the top surface of each one of the interconnect structures, and wherein a gap is maintained around the one or more interconnects and the one or more layers of photodefinable material when the one or more layers of photodefinable material exhibit a positive print bias.

15. The method of claim 12, wherein said curing process comprises an oven curing process.

16. The method of claim 12, wherein the selective removing comprises one or more of: chemical etch, dry etch, and mechanical etch.

17. The method of claim 12, wherein the one or more layers of photodefinable material is formed to a height above the second top surface of the interconnect structures to provide a compression in the one or more layers of compliant material after a final assembly.

18. A method of forming a stacked semiconductor device, comprising:

forming one or more layers of compliant material adjacent to interconnect structures on a first substrate and adjacent to interconnect structures on a second substrate;

selectively removing a portion of the one or more layers of compliant material such that a first top surface of the one or more layers of compliant material is lower than a second top surface of the interconnect structures; and bonding said first substrate to said second substrate to form a stacked semiconductor device that is supported structurally by said complaint material, and in which said compliant material is located between said first substrate and said second substrate.

19. The method of claim 18, further comprising:

curing said compliant material at a first temperature prior to said bonding, and wherein said one or more layers of compliant material is formed to a height above the second top surface of the interconnect structures to provide a compression in the one or more layers of compliant material after a final assembly.

20. The method of claim 19, wherein said bonding is performed by elevating said interconnect structures to a second temperature not exceeding the curing temperature of the compliant material, and wherein a gap is maintained around the interconnect structures and the one or more layers of compliant material when the one or more layers of compliant material exhibit a positive print bias.

21. The method of claim 19, wherein said first temperature is 300 C for 90 minutes.

22. The method of claim 18, wherein said compliant material is subject to one or more surface treatments to improve the adhesion properties of said compliant material.

23. The method of claim 18, wherein said compliant material is formed above the top surface of said interconnect structures so as to compress when said first substrate is bonded with said second substrate.

* * * * *

UNITED STATES PATENT AND TRADEMARK OFFICE
CERTIFICATE OF CORRECTION

PATENT NO. : 6,946,384 B2
DATED : September 20, 2005
INVENTOR(S) : Kloster et al.

It is certified that error appears in the above-identified patent and that said Letters Patent is hereby corrected as shown below:

Title page,
Item [57], ABSTRACT,
Line 8, delete "layer" and insert -- layers --.

Column 5,
Line 6, delete "," and insert -- . --.
Line 28, delete "18" and insert -- 118 --.
Line 50, delete "is".

Column 6,
Line 42, delete "tilled" and insert -- filled --.

Signed and Sealed this

Thirteenth Day of December, 2005

JON W. DUDAS
*Director of the United States Patent and Trademark Office*